United States Patent
Brissot et al.

(10) Patent No.: US 7,109,054 B2
(45) Date of Patent: Sep. 19, 2006

(54) IMAGE SENSOR WITH RECESSED PLANARIZING LAYERS AND METHOD FOR MAKING SAME

(75) Inventors: Louis Brissot, St Egreve (FR); Amédée Sollier, Saint Aupre (FR)

(73) Assignee: ATMEL Grenoble S.A., Saint Egreve (FR)

( * ) Notice: Subject to any disclaimer, the term of this patent is extended or adjusted under 35 U.S.C. 154(b) by 190 days.

(21) Appl. No.: 10/488,942

(22) PCT Filed: Sep. 10, 2002

(86) PCT No.: PCT/FR02/03079

§ 371 (c)(1),
(2), (4) Date: Mar. 9, 2004

(87) PCT Pub. No.: WO03/026016

PCT Pub. Date: Mar. 27, 2003

(65) Prior Publication Data

US 2004/0241899 A1    Dec. 2, 2004

(30) Foreign Application Priority Data

Sep. 14, 2001 (FR) .................................. 01 11938

(51) Int. Cl.
*H01L 21/00* (2006.01)
(52) U.S. Cl. ...................................................... 438/48

(58) Field of Classification Search ................. 438/48, 438/57, 69, 584, 758, 778
See application file for complete search history.

(56) References Cited

U.S. PATENT DOCUMENTS

| 4,841,348 A | * | 6/1989 | Shizukuishi et al. ........ 257/226 |
| 5,273,910 A | | 12/1993 | Tran et al. |
| 6,297,071 B1 | * | 10/2001 | Wake .......................... 438/70 |

FOREIGN PATENT DOCUMENTS

| EP | 0 721 220 A | 7/1996 |
| EP | 1 050 907 A | 11/2000 |

* cited by examiner

*Primary Examiner*—Scott B. Geyer
(74) *Attorney, Agent, or Firm*—Lowe Hauptman & Berner, LLP

(57) ABSTRACT

The present invention relates to the fabrication of image sensors and especially to color image sensors. The image sensor includes a region in which there is a photosensitive matrix onto which the image to be converted into electronic signals is projected and an outer region comprising peripheral electronic circuits for driving the matrix or for processing the image signals. After formation on a substrate of a stack of conducting layers and insulating layers serving for the production of the matrix of the peripheral circuits, a substantial thickness of insulation is removed only in the region of the matrix before a mosaic of color filters is deposited so as to reduce the height of the filters relative to the photosensitive regions.

9 Claims, 3 Drawing Sheets

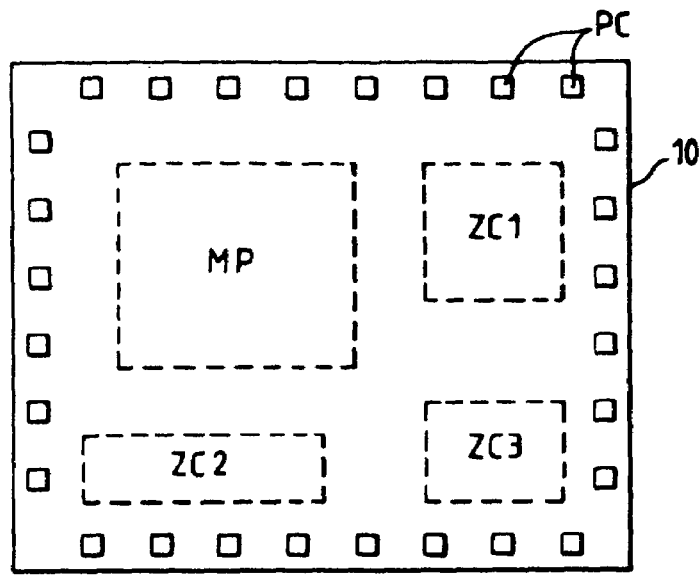
FIG.1
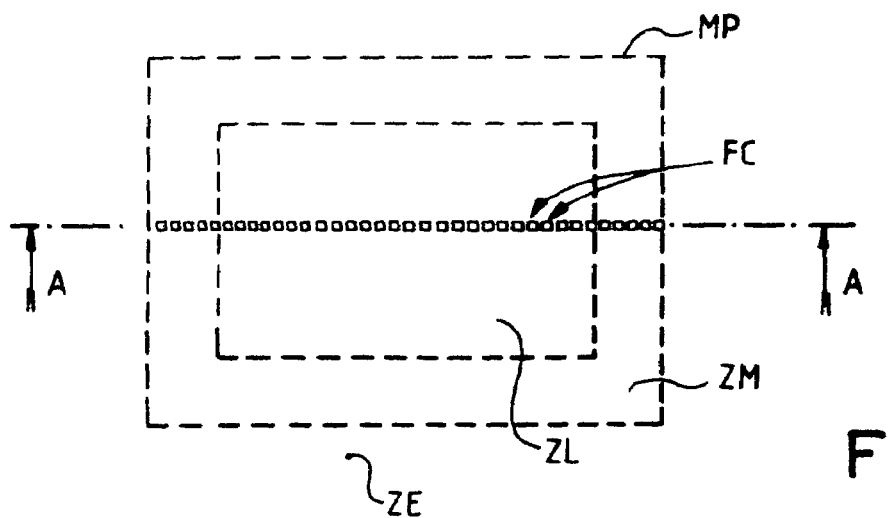
FIG.2
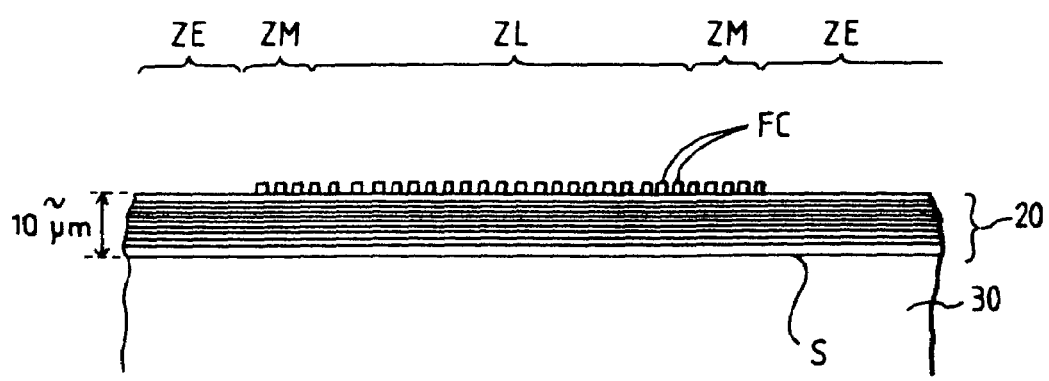
FIG.3   A-A cross section

IMAGE SENSOR WITH RECESSED PLANARIZING LAYERS AND METHOD FOR MAKING SAME

The invention relates to electronic image sensors and particularly to color image sensors.

Such sensors are produced on silicon chips using various technologies, including CMOS (Complementary Metal Oxide Semiconductor) technology and hybrid CMOS/CCD technologies (CCD standing for Charge Coupled Device). These technologies allow the integration on the same silicon chip not only of a matrix of photosensitive points onto which the image to be converted into an electronic signal is projected, but also peripheral electronic circuits that surround this matrix and serve either for driving the matrix for the purpose of converting an image into an electronic signal or for processing the electronic signal coming from the matrix after conversion of the image.

For a color image sensor, the upper surface of the photosensitive matrix is covered with a mosaic of color filters organized in registration with the matrix array of photosensitive points. Each individual filter is located above a respective photosensitive silicon region that receives light of a single color. The immediately adjacent filters, above immediately adjacent photosensitive regions, have different colors and correspond to different image points or pixels.

The color filters are placed above the insulating and conducting layers that serve to define the photosensitive points, the internal interconnections at a given photosensitive point and the interconnections with the rest of the chip (row conductors, column conductors, etc.).

Now, in the technologies currently employed, these interconnections can be produced only using several levels of conducting and insulating layer deposition and etching, above the silicon surface that contains the actual photosensitive regions, namely those that convert photons into electric charges at each pixel.

Typically, six levels of interconnection are used to produce the entire chip constituting the image sensor and its associated circuits, for example two polycrystalline silicon levels (polycrystalline silicon being likened to a conductor within the context of the invention) and four aluminum levels.

The thickness of a conducting level (aluminum level or polycrystalline silicon level) can barely go below a few tenths of a micron owing to the electrical conductivity requirements. Two successive levels must be separated by an insulating layer of approximately one micron, firstly to produce sufficient insulation and secondly to sufficiently planarize the surface after etching of a conducting level and before deposition and etching of a following layer.

Indeed, planarization is a necessary operation; it consists in filling the steps formed by etching the preceding level, by depositing a layer whose thickness will be smaller at the point where the regions of the preceding level were formed but larger at the point where the material of the preceding level was removed by selective etching, so that, after the planarization step, the upper surface of the chip is virtually planar. This planarity is useful for two reasons: firstly, it makes photolithography of the following layer easier, since photolithography is more effective and more precise on a planar layer than on a layer having hollows and bumps and, secondly, it makes it easier to deposit and etch (again by photolithography) the mosaic of color filters after all the intermediate layers have been formed. The mosaic of filters is then deposited only after a last planarization layer has been formed after deposition of all the other interconnection layers and the intermediate planarization layers between these layers.

In a conventional technology, the mosaic of color filters thus ends up being at a height of approximately 10 microns above the photosensitive silicon region. However, this region has sides of barely only a few microns in the case of a sensor of sufficient resolution. The photosensitive region therefore lies as it were at the bottom of a well filled with a superposition of insulating transparent layers surrounded by other superpositions of insulating and conducting layers that define this well (the conducting layers are usually opaque and reflective, in particular when they are made of aluminum).

It follows that photons that have passed through a color filter do not immediately reach the photosensitive region corresponding to this filter; along the path that remains to be traveled after the color filter, they may be attenuated, dispersed, undergo refractions, reflections, etc. Apart from the loss of sensitivity that ensues, it will be understood that some of the photons may reach a neighboring photosensitive region. In monochromatic light, this results in a certain loss of spatial resolution. However, in a color camera the problem is much more critical, since even image regions having only low spatial frequencies (for example an image region of uniform red color) are very greatly affected—the color is systematically degraded since the pixels corresponding to the other colors always receive a fraction of the light flux that is not intended for them. The quality of the colorimetry is therefore particularly degraded by light dispersion in the gap that separates the color filter from the photosensitive region that corresponds to it.

The object of the present invention is to propose a fabrication process and a structure for a color image sensor that appreciably improve the colorimetric quality of the images obtained, together with the resolution, contrast and sensitivity in low light, at the cost of a slight increase in production complexity.

Although the main benefit of the process is for color sensors, it should be noted that the process can be used with some advantage in the case of non colored image sensors.

What is therefore proposed is an integrated image sensor produced on a planar semiconductor substrate, the sensor comprising a matrix of photosensitive elements in a first region of the substrate and peripheral circuits in a second region, the sensor being produced from a superposition of several levels of insulating layers alternating with etched conducting layers, in which superposition the insulating layers serve as planarization layers for the etched conducting layers, the sensor being characterized in that the cumulative height above the semiconductor substrate of the insulating layers present in the first region is less than the cumulative height of the insulating layers in the second region.

The light that has to reach, from above, the photosensitive matrix will pass through a smaller thickness of insulating transparent layers than if the cumulative height were the same in the two regions. The light will therefore be less attenuated and will undergo fewer undesirable reflections and dispersions than if all the planarization layers necessary for producing the circuits of the second region had been kept over the entire silicon chip.

In practice, there is a smaller number of superposed insulating layers, serving as planarization layers, in the first region than in the second at the end of the fabrication process. The additional planarization layers, present in the second region but not in the first, are selectively removed from the first region at the end of the operations for depositing and etching the various layers, whereas during these operations the conducting and insulating layers are deposited uniformly both in the first region (photosensitive matrix) and in the second (peripheral circuits).

The overall configuration of the deposited conducting layers will in principle be such that the number of conducting levels in the photosensitive matrix region will be less than the number of conducting levels outside this region; the first levels of conducting layers are used both in the matrix region and outside this region, whereas other additional conducting levels will be present only outside the matrix.

Overall, the stack of conducting and semiconductor layers used to produce all the electronic circuits of the chip, the photosensitive matrix included, will have a hollow within the photosensitive matrix, the thickness of the stack being smaller in the matrix region than outside this stack. The thickness will preferably be at least 30%, and preferably 50%, less in the matrix region.

For a color sensor, a mosaic of color filters is present above the photosensitive matrix, and therefore at the point where the stack of insulating and conducting layers has a smaller thickness than over the rest of the chip.

To obtain this improvement in the performance of image sensors, the invention proposes a process for fabricating an image sensor, in which process several conducting layers alternating with insulating layers are deposited on a semiconductor substrate and etched in succession in order to define, on the one hand, a photosensitive matrix in a first region of an integrated-circuit chip and, on the other hand, peripheral circuits in a second region of the chip, the insulating layers serving in particular as planarization layers after the conducting layers have been deposited and etched, this process being characterized in that the insulating and conducting layers are deposited over the entire surface of the chip, each layer then being etched in a respective pattern, and then a thickness of insulation is uniformly removed above the photosensitive matrix and left above the peripheral circuits.

Other features and advantages of the invention will become apparent on reading the detailed description that follows, this being given with reference to the appended drawings in which:

FIG. 1 shows an overall plan view of an integrated-circuit chip comprising a photosensitive matrix and peripheral circuits;

FIG. 2 shows the region corresponding to the matrix;

FIG. 3 shows a lateral cross section of the integrated-circuit chip;

FIG. 1 shows a top view of an integrated-circuit chip 10 produced on a silicon substrate and constituting the core of an image sensor with a first region MP that corresponds to a photosensitive matrix onto which the electronic image to be detected is projected.

Figure 4:
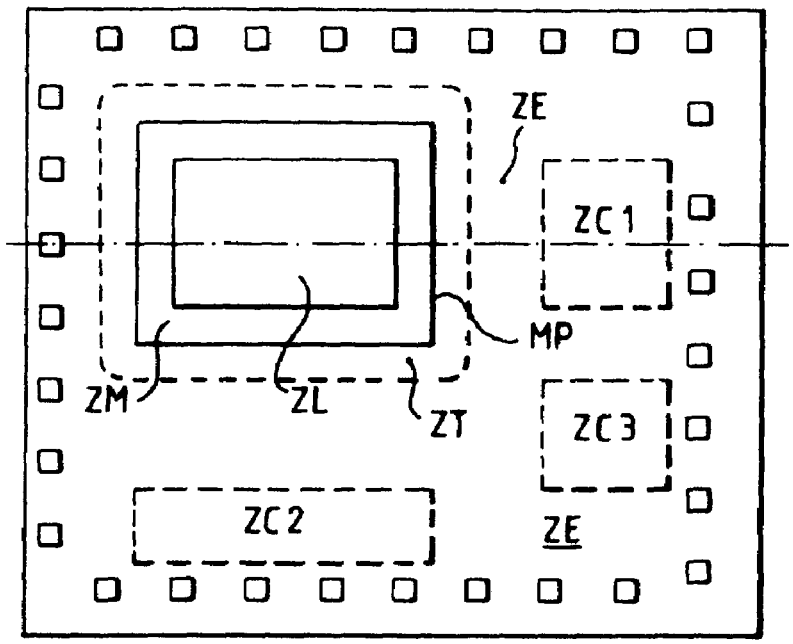
FIG. 4 shows a top view of the image sensor chip according to the invention.

Typically, the integrated-circuit chip is placed to the rear of a focusing objective, the focal plane of which is the surface of the silicon substrate.

The region MP is surrounded by other regions ZC1, ZC2, ZC3 which comprise electronic circuits serving either for driving the photosensitive matrix or for processing the signals obtained from the matrix.

The chip is surrounded in general by connection pads PC for connecting the sensor to the outside of the sensor. Finally, extending between the photosensitive matrix, the electronic circuits and the pads are arrays of interconnect conductors (not shown).

The photosensitive matrix, the electronic circuits, the interconnect conductors and the pads are firstly produced by means of impurity-implantation, diffusion and oxidation operations carried out in the silicon substrate (especially in order to form photosensitive regions at each pixel of the matrix and to form transistor sources and drains) and then by means of a deposition and etching of alternating insulating and conducting layers on top of the surface of the silicon substrate.

The technology to produce the photosensitive matrix may be a CCD (Charge Coupled Device) technology or a CMOS (Complementary Metal Oxide Semiconductor) technology. It is becoming increasing common to produce the peripheral electronic circuits in CMOS technology.

FIG. 2 shows, again in a top view, the region MP reserved for the photosensitive matrix. In practice, a central portion ZL of the matrix MP is reserved for receiving the light image to be converted into electronic signals. A peripheral portion ZM, constructed like the matrix and forming part of the same array as the matrix, is reserved for forming reference pixels for electronic balancing of the matrix. This region is entirely masked by an aluminum layer and the photosensitive points located beneath it receive no light; they therefore transmit black level information. The combination of the masked region ZM and the unmasked region ZL constitutes the region MP reserved for the photosensitive matrix. Outside this region is the region ZE in which all the other elements of the sensor, and especially the peripheral circuits of the regions ZC1, ZC2, ZC3 that form part of the region ZE, are located.

Deposited in the matrix region is a mosaic of color filters FC, only a single line of which is shown in FIG. 2. Each filter is above a pixel of the matrix.

FIG. 3 shows a cross section of FIG. 2, on a greatly enlarged scale, in the vertical direction. Given the complexity of producing the matrix and its associated peripheral circuits, it is necessary to form a succession of many alternating insulating and conducting layers, each being etched in a respective pattern. The height of the resulting stack 20 is around ten microns above the surface S of the silicon substrate 30 and the optional color filters are deposited above this planarized stack.

According to the invention, a substantial thickness of insulation present in the region dedicated to the matrix MP is removed throughout this region before the color filters are deposited. This is because the upper part of the insulation present above the matrix is not used to insulate conducting layers from one another, and it can be removed. Conversely, in the peripheral circuits this upper part is used to insulate conducting layers from one another, and must not be removed in the regions corresponding to these circuits.

Figure 5:
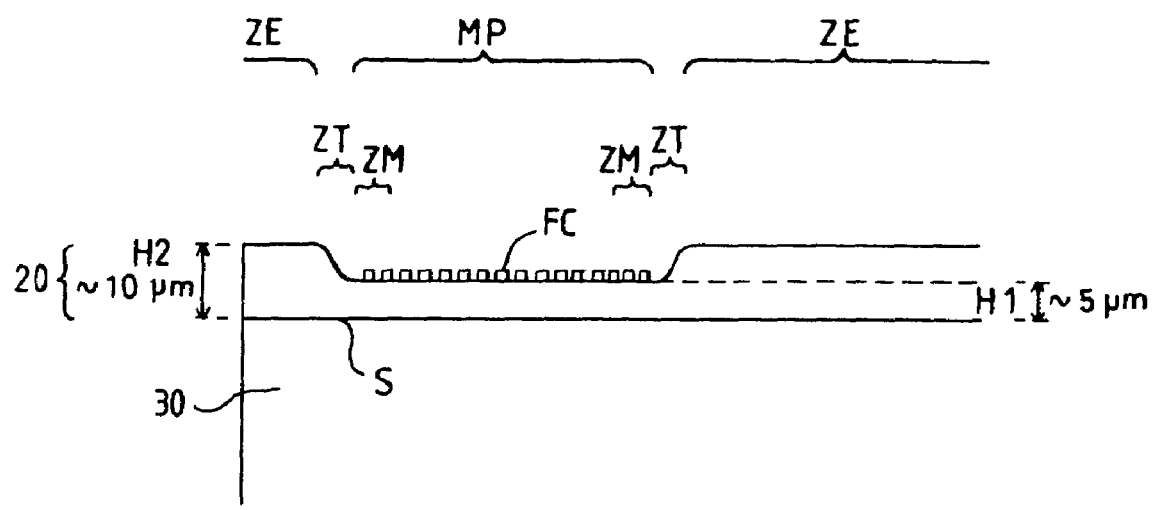
FIG. 5 shows a lateral cross section of this chip.

As may be seen in FIG. 4 and FIG. 5, the insulation is removed uniformly from the region MP (both the illuminated region ZL and the masked region ZM), but remains in the outer region ZE. Also shown is a transition region ZT all around the region MP, in which the height of the stack of insulating and conducting layers varies between a low level H1 (region MP) and a high level H2 (region ZE).

The stack 20 of insulating and conducting layers therefore has a hollow throughout the region MP, and it is in this hollow that the color filters FC are deposited in the case of a color image sensor, or other optical components (such as microlenses) in the case of a monochrome sensor. The height of the stack is reduced by at least 30% and preferably at least 50% in the region MP. It may therefore be approximately 5 microns in the region MP compared with 10 microns in the region ZE.

Figure 6:
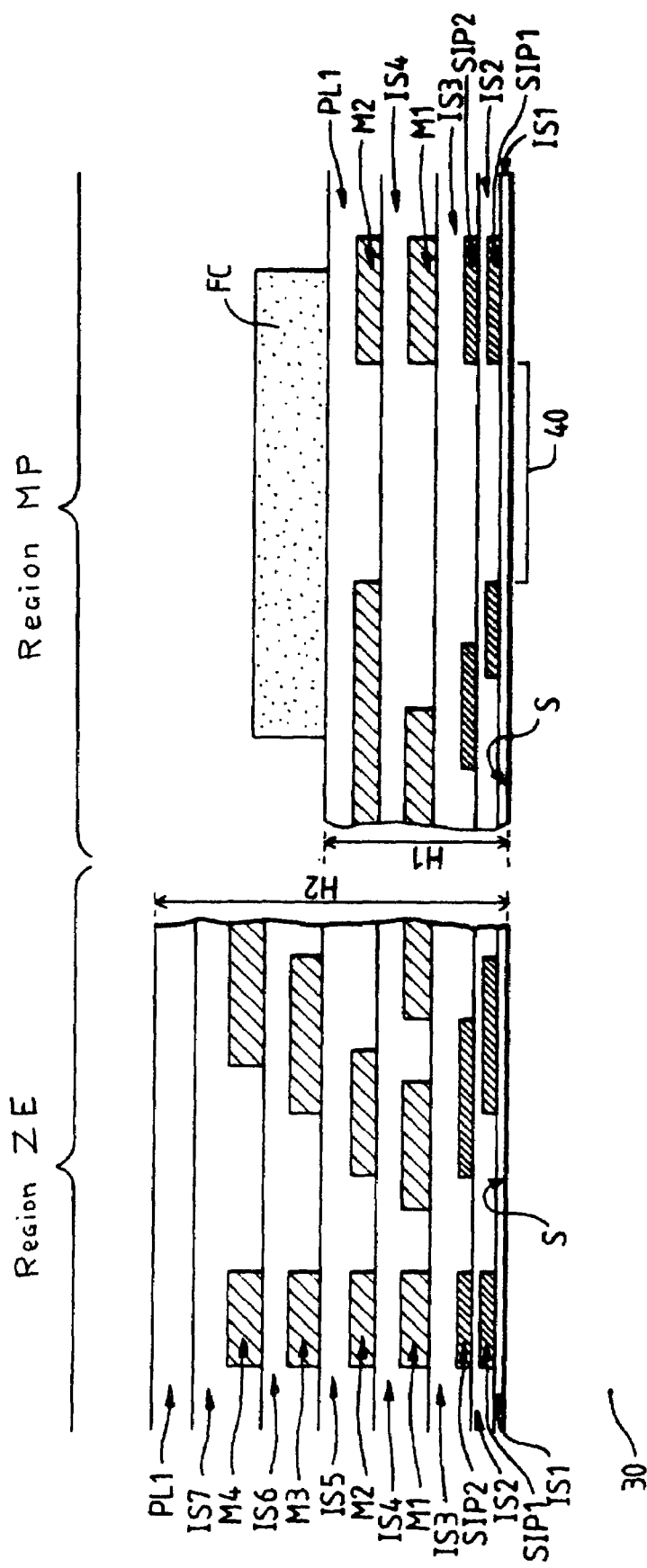
FIG. 6 shows the stack of conducting and insulating layers according to the invention in the matrix region (on the right) and outside it (on the left).

The details of the deposited layers are given in FIG. 6 in a typical embodiment. On the left of the figure may be seen the stack in the region ZE, and on the right may be seen the stack in the region MP.

Doped regions 40 are implanted in the substrate 30 beneath the surface S in order to form p-n junctions with the substrate, constituting photodiodes that extend along sides of a few microns. Other impurity implantation operations (the formation of sources, drains, etc.) are carried out in the substrate, both in the region MP and the region ZE.

A typical succession of insulating and conducting layers that will then be found on the substrate is given below. The conducting layers, which are generally opaque if made of aluminum or slightly transparent if made of polycrystalline silicon, are etched in the desired interconnection patterns, but in any case are not present above the photodiodes in order not to impair the exposure thereof. The conducting layers have therefore been shown on the photodiode side.

To simplify the drawing, the contact apertures, formed locally in the insulating layers, allowing contact to be made by the deposition of conducting material between two different conducting layers, have not been shown.

A typical stack is the following:

a first insulating layer IS1 covers the junctions, with a thickness of approximately 0.1 to 0.2 microns;

a first polycrystalline silicon layer SIP1 is deposited on top of this layer and forms charge transfer gates or transistor gates, with a thickness of approximately 0.3 microns;

a second insulating layer IS2, with a thickness of approximately 0.1 to 0.2 microns;

a second polycrystalline silicon layer SIP2, with a thickness of approximately 0.3 microns;

a third insulating layer IS3, with a thickness of approximately 1 micron;

a first conducting metal (aluminum) layer M1, with a thickness of 0.6 microns;

a fourth insulating layer IS4, with a thickness of approximately 1 micron; and a second conducting layer M2, with a thickness of approximately 0.6 microns.

In this embodiment, all the above layers are in both the region MP and in the region ZE. The last metallization level of the region MP is the level M2. The insulating planarization layers IS1 to IS4 are necessarily transparent as they remain above the region MP at the end of fabrication.

Other metal layers M3 and M4 and insulating layers for separation and for planarization will be subsequently deposited, both in the region MP and in the region ZE, but they will be completely removed from the region MP: the metallization levels will be removed during the operation of etching these levels, because they are of no use to the electrical operation of the matrix; the insulating levels will in principle not be removed at the etching stage before deposition of a subsequent conducting layer (although it is theoretically possible to do so for certain levels), but they will be completely removed during the step of uniformly removing a thickness of insulation above the region MP.

From this point and until this removal operation, the insulating planarization layers are not necessarily transparent, since they will be removed. In practice, they are nevertheless of the same nature as the previous layers (transparent silicon oxide).

A fifth insulating planarization layer IS5 (with a thickness of approximately 1 micron) is therefore uniformly deposited on the chip after the metal layer M2 has been etched. It is etched in the region ZE so as in particular to define apertures for contact with the lower conducting layers layer M2.

A third conducting (aluminum) layer M3, with a thickness of approximately 0.6 microns, is deposited and etched. It remains only in the region ZE.

A sixth insulating planarization layer IS6, with a thickness of approximately 1 micron, is deposited uniformly on the chip and etched in the region ZE to define apertures for contact with the lower conducting layers.

A fourth conducting layer M4, with a thickness of approximately 0.6 microns, is uniformly deposited on the chip, etched, and removed from the region MP.

A seventh insulating layer IS7, with a thickness of approximately 2 microns, is in principle uniformly deposited at this stage on the chip, although this is not obligatory since it can be replaced with a planarization layer deposited after the region MP has been hollowed out.

The operation of removing part of the thickness of insulation lying above the region MP is then carried out, this thickness not being needed for the electrical operation in this region. This operation is performed with a mask that protects the region ZE. The insulation is hollowed out either down to a depth adjusted to a desired value, or until the baring of the last metallization level present in the region MP, namely the level M2 in this example, has been detected.

During this operation, the insulating layers IS5, IS6 and IS7 completely or almost completely disappear from the region MP (a little of the layer IS5 may remain locally).

An insulating planarization layer PL1 is deposited over the entire surface of the chip.

A layer of color filters FC, with a thickness of approximately 2 microns, may then be deposited and etched, removed from the region ZE and left only above the region MP. Subsequently, after further planarization steps, microlenses may be formed on the matrix MP (with one lens per color pixel).

After the operation of uniformly removing insulation from the region MP, the cumulative height H1 of the insulating layers in the region MP is markedly less than the cumulative height H2 in the region ZE, which results in the hollow visible in FIG. 5 within the region MP. The color filters are deposited in this hollow and therefore have a height H1 above the silicon surface that is lower than in the prior art.

The invention claimed is:

1. A process for fabricating an image sensor, comprising the steps of:

depositing several conducting layers alternating with transparent insulating layers on a semiconductor substrate and etching in succession in order to define, a photosensitive matrix in a first region of an integrated-circuit chip and, peripheral circuits in a second region of the chip, the insulating layers serving in particular as planarization layers after the conducting layers have been deposited and etched, wherein the insulating and conducting layers are deposited over the entire surface of the chip, each layer then being etched in a respective pattern, and then a thickness of insulation is uniformly removed above the photosensitive matrix and left above the peripheral circuits.

2. The process as claimed in claim 1, wherein the thickness of insulation removed represents at least 30%, and preferably at least 50%, of the thickness of insulation present on the chip at the time of this removal step.

3. The process as claimed in claim 2, comprising the steps of: in which process are depositing several conducting layers alternating with transparent insulating layers on a semiconductor substrate and etching in succession in order to define, a photosensitive matrix in a first region of an integrated-circuit chip and, peripheral circuits in a second region of the chip, the insulating layers serving in particular as planarization layers after the conducting layers have been deposited and etched, wherein the insulating and conducting layers are deposited over the entire surface of the chip, each layer then being etched in a respective pattern, and then a thickness of insulation is uniformly removed above the photosensitive matrix and left above the peripheral circuits.

4. The process as claimed in claim 2, wherein a mosaic of color filters is put into place after the removal step and after an optional step of depositing a transparent planarization layer.

5. The process as claimed in claim 1, wherein the photosensitive matrix is formed from several conducting layers, including a last metallization level for this region, in that planarization layers are deposited over the entire surface of the chip after this last level, followed by additional alternating conducting and insulating layers, the etching of these conducting layers leaving these layers only in the second region, and in that the step of removing a thickness of insulation consists in removing the insulation to the point of baring said last metallization level of the photosensitive matrix.

6. The process as claimed in claim 5, wherein the removal step is followed by a step of depositing a transparent planarization layer.

7. The process as claimed in claim 6, wherein a mosaic of color filters is put into place after the removal step and after an optional step of depositing a transparent planarization layer.

8. The process as claimed in claim 5, wherein a mosaic of color filters is put into place after the removal step and after an optional step of depositing a transparent planarization layer.

9. The process as claimed in claim 1, wherein a mosaic of color filters is put into place after the removal step and after an optional step of depositing a transparent planarization layer.

* * * * *